(12) United States Patent
Myung

(10) Patent No.: US 11,854,916 B2
(45) Date of Patent: Dec. 26, 2023

(54) METHOD FOR EVALUATING PLACEMENT OF SEMICONDUCTOR DEVICES

(71) Applicant: MakinaRocks Co., Ltd., Seoul (KR)

(72) Inventor: Wooshik Myung, Seoul (KR)

(73) Assignee: MAKINAROCKS CO., LTD., Seoul (KR)

( * ) Notice: Subject to any disclaimer, the term of this patent is extended or adjusted under 35 U.S.C. 154(b) by 0 days.

(21) Appl. No.: 18/094,696

(22) Filed: Jan. 9, 2023

(65) Prior Publication Data

US 2023/0253272 A1 Aug. 10, 2023

(30) Foreign Application Priority Data

Feb. 4, 2022 (KR) .................. 10-2022-0014530
Aug. 3, 2022 (KR) .................. 10-2022-0096853

(51) Int. Cl.
| | |
|---|---|
| H01L 21/66 | (2006.01) |
| G06F 30/392 | (2020.01) |
| G06F 30/27 | (2020.01) |
| G06F 30/394 | (2020.01) |

(52) U.S. Cl.
CPC .............. *H01L 22/34* (2013.01); *G06F 30/27* (2020.01); *G06F 30/392* (2020.01); *G06F 30/394* (2020.01); *H01L 22/14* (2013.01)

(58) Field of Classification Search
USPC ........................................................ 716/119
See application file for complete search history.

(56) References Cited

U.S. PATENT DOCUMENTS

| | | | |
|---|---|---|---|
| 5,926,396 A | 7/1999 | Ohara | |
| 7,937,678 B2* | 5/2011 | Lippmann | G06F 30/327 |
| | | | 716/103 |
| 10,141,227 B1 | 11/2018 | Suarez et al. | |
| 2014/0189620 A1* | 7/2014 | Chang | G06F 30/327 |
| | | | 716/103 |
| 2015/0040095 A1* | 2/2015 | Kazda | G06F 30/398 |
| | | | 716/135 |
| 2020/0372196 A1* | 11/2020 | Bhowmick | G06F 30/333 |
| 2022/0335197 A1* | 10/2022 | Hsu | G06F 30/394 |
| 2023/0023101 A1* | 1/2023 | Su | G06F 17/16 |

FOREIGN PATENT DOCUMENTS

| | | |
|---|---|---|
| JP | 2015167041 A | 9/2015 |
| JP | 2017123010 A | 7/2017 |
| KR | 940018898 A | 8/1994 |
| KR | 100296183 B1 | 10/2001 |
| KR | 100300055 B1 | 10/2001 |
| KR | 102038736 B1 | 10/2019 |
| KR | 1020200096948 A | 8/2020 |
| KR | 102178035 B1 | 11/2020 |
| KR | 1020210082210 A | 7/2021 |

OTHER PUBLICATIONS

Korea Patent Office, Office Action, Dispatch Date Mar. 17, 2022.

* cited by examiner

*Primary Examiner* — Mohammed Alam
(74) *Attorney, Agent, or Firm* — Umberg Zipser LLP

(57) ABSTRACT

Disclosed is a method of evaluating placement of semiconductor devices performed by a computing device according to an exemplary embodiment of the present disclosure. The method includes receiving connection information representing a connection relationship between semiconductor devices; clustering the semiconductor devices based on the connection information; and determining a reward to train a neural network model based on clustering.

8 Claims, 14 Drawing Sheets

|  |  |  |
|---|---|---|
|  | 4/12 |  |
|  | 4/12 |  |
|  |  |  |

62

|  |  |  |
|---|---|---|
|  | 2/12 |  |
|  | 4/12 |  |
|  |  |  |

| 3/12 | 4/12 | 1/12 |
|---|---|---|
| 2/12 | 4/12 | 2/12 |
| 1/12 | 4/12 | 3/12 |

62

| 3/12 | 2/12 | 1/12 |
|---|---|---|
| 4/12 | 4/12 | 4/12 |
| 1/12 | 2/12 | 3/12 |

Fig.14

METHOD FOR EVALUATING PLACEMENT OF SEMICONDUCTOR DEVICES

CROSS-REFERENCE TO RELATED APPLICATIONS

This application claims priority to and the benefit of Korean Patent Application No. 10-2022-0014530 filed in the Korean Intellectual Property Office on Feb. 4, 2022, the entire contents of which are incorporated herein by reference.

TECHNICAL FIELD

The present disclosure relates to a semiconductor device placement evaluating method, and more particularly, to a reinforcement learning based semiconductor device placement evaluating method using clustering.

This study was carried out as a part of the private intelligent information service expansion project of the Ministry of Science and ICT and the Information and Communication Industry Promotion Agency (A0903-21-1021, development of AI based semiconductor design automation system)

BACKGROUND ART

Despite technological advances, the reality is that generally, a logical design of semiconductors which can be seen as an integral part of the high-tech industry is performed directly by engineers using a rule based software. Accordingly, the logical design of the semiconductor should be performed based on the experience of the engineers and the design speed may greatly vary depending on the skill of the engineers. Further, actually, it is very difficult for the engineer to efficiently place tens to millions of semiconductor devices while keeping the connection relationship of the semiconductor devices in mine. That is, since the current semiconductor designing process depends on the engineer's experience and intuition, it is difficult to maintain a consistent design quality and a considerable amount of time and money to be invested for the design is inevitably required.

Evaluation performed for tens to millions of placed semiconductor devices has also high complexity. It takes a lot of time to evaluate the placement of tens to millions of semiconductor devices so that study for a semiconductor device placement evaluating method to reduce the complexity of the operation is necessary.

Korean Patent No. 10-0296183 (Oct. 22, 2001) discloses a design method of a semiconductor integrated circuit.

SUMMARY OF THE INVENTION

The present disclosure has been made in an effort to correspond to the above-described background and an object thereof is to provide a method of evaluating placement of semiconductor devices to reduce the problem complexity by reducing a number of objects to be evaluated by the clustering.

In order to achieve the above-described objects, a method performed by a computing device according to an exemplary embodiment of the present disclosure will be described. The method includes receiving connection information representing a connection relationship between semiconductor devices; clustering the semiconductor devices based on the connection information; and determining a reward to train a neural network model based on clustering.

As an alternative, the clustering includes: converting the connection information with a hypergraph structure into an ordinary graph structure which expresses the connection relationship between semiconductor devices one to one.

As an alternative, the training of the neural network model includes: performing an action to dispose the semiconductor device in a canvas based on the state including the connection information, by means of the neural network model; and performing reinforcement learning for the neural network model by returning the determined reward to the neural network model.

As an alternative, the method further includes: assuming a plurality of semiconductor devices included in the same cluster as one semiconductor device based on the clustering; and determining the reward based on the assumed one semiconductor device.

As an alternative, the reward is determined based on at least one of a length of a wire which connects the semiconductor devices calculated in consideration of the semiconductor device assumed by the clustering or a congestion of the semiconductor devices calculated in consideration of the semiconductor device assumed through the clustering.

As an alternative, the reward is computed by a weighted sum of the length of wire and the congestion.

As an alternative, the length of the wire may include a sum of wire lengths computed between the semiconductor device assumed by the clustering and the other external semiconductor device and a fixed value of the length of the wire computed between the semiconductor devices in the clustering.

As an alternative, the congestion includes a sum of congestions computed between the semiconductor device assumed by the clustering and the other external semiconductor device; and a fixed value of the congestion computed between the semiconductor devices in the clustering.

In order to achieve the above-described objects, according to an aspect of the present disclosure, a computer program stored in a computer readable storage medium is disclosed. When the computer program is executed in one or more processors, the computer program allows the processor to perform the following operations to evaluate the placement of the semiconductor devices. The operations include: an operation of receiving connection information representing a connection relationship between semiconductor devices; An operation of clustering the semiconductor devices based on the connection information; and an operation of determining a reward to train a neural network model based on clustering.

In order to achieve the above-described objects, according to an aspect of the present disclosure, a computing device is disclosed. The device includes: a processor including at least one core; a memory including executable program codes in the processor; and a network unit which receives connection information representing a connection relationship between semiconductor devices; the processor is configured to cluster the semiconductor devices based on the connection information; and determine a reward to train a neural network model based on clustering.

According to the present disclosure, a method for evaluating placement of semiconductor devices to reduce the complexity of the operation is provided to evaluate the placement of the semiconductor devices.

BRIEF DESCRIPTION OF THE DRAWINGS

FIGS. 6 to 14 are conceptual views illustrating a process of estimating a congestion according to an exemplary embodiment of the present disclosure;

DETAILED DESCRIPTION

Figure 1:
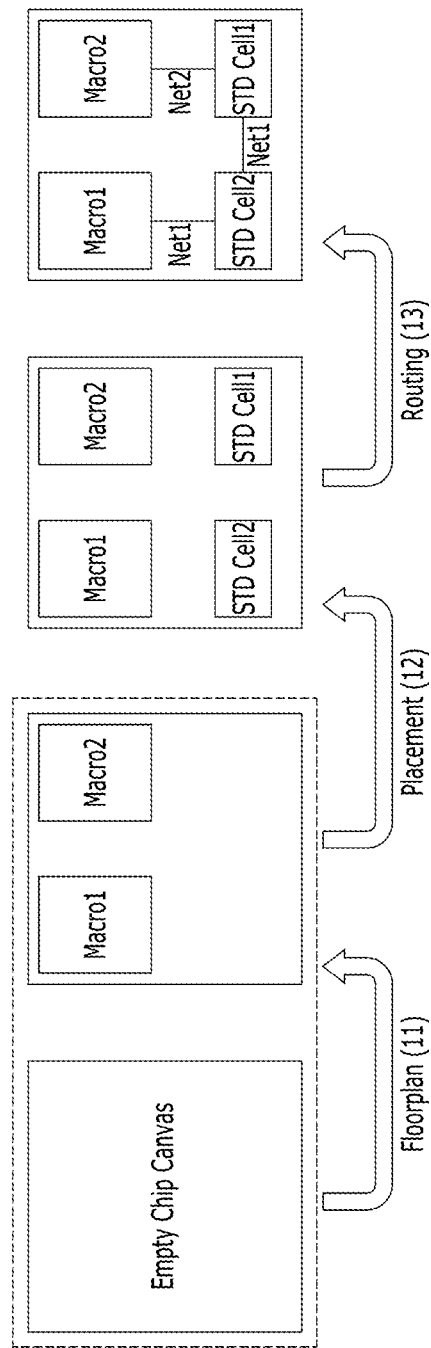
FIG. 1 is a conceptual view illustrating a basic semiconductor design process.

Various exemplary embodiments will now be described with reference to drawings. In the present specification, various descriptions are presented to provide appreciation of the present disclosure. However, it is apparent that the exemplary embodiments can be executed without the specific description.

"Component", "module", "system", and the like which are terms used in the specification refer to a computer-related entity, hardware, firmware, software, and a combination of the software and the hardware, or execution of the software. For example, the component may be a processing procedure executed on a processor, the processor, an object, an execution thread, a program, and/or a computer, but is not limited thereto. For example, both an application executed in a computing device and the computing device may be the components. One or more components may reside within the processor and/or a thread of execution. One component may be localized in one computer. One component may be distributed between two or more computers. Further, the components may be executed by various computer-readable media having various data structures, which are stored therein. The components may perform communication through local and/or remote processing according to a signal (for example, data transmitted from another system through a network such as the Internet through data and/or a signal from one component that interacts with other components in a local system and a distribution system) having one or more data packets, for example.

The term "or" is intended to mean not exclusive "or" but inclusive "or". That is, when not separately specified or not clear in terms of a context, a sentence "X uses A or B" is intended to mean one of the natural inclusive substitutions. That is, the sentence "X uses A or B" may be applied to any of the case where X uses A, the case where X uses B, or the case where X uses both A and B. Further, it should be understood that the term "and/or" used in this specification designates and includes all available combinations of one or more items among enumerated related items.

It should be appreciated that the term "comprise" and/or "comprising" means presence of corresponding features and/or components. However, it should be appreciated that the term "comprises" and/or "comprising" means that presence or addition of one or more other features, components, and/or a group thereof is not excluded. Further, when not separately specified or it is not clear in terms of the context that a singular form is indicated, it should be construed that the singular form generally means "one or more" in this specification and the claims.

The term "at least one of A or B" should be interpreted to mean "a case including only A", "a case including only B", and "a case in which A and B are combined".

Those skilled in the art need to recognize that various illustrative logical blocks, configurations, modules, circuits, means, logic, and algorithm steps described in connection with the exemplary embodiments disclosed herein may be additionally implemented as electronic hardware, computer software, or combinations of both sides. To clearly illustrate the interchangeability of hardware and software, various illustrative components, blocks, configurations, means, logic, modules, circuits, and steps have been described above generally in terms of their functionalities. Whether the functionalities are implemented as the hardware or software depends on a specific application and design restrictions given to an entire system. Skilled artisans may implement the described functionalities in various ways for each particular application. However, such implementation decisions should not be interpreted as causing a departure from the scope of the present disclosure.

The description of the presented exemplary embodiments is provided so that those skilled in the art of the present disclosure use or implement the present disclosure. Various modifications to the exemplary embodiments will be apparent to those skilled in the art. Generic principles defined herein may be applied to other embodiments without departing from the scope of the present disclosure. Therefore, the present disclosure is not limited to the exemplary embodiments presented herein. The present disclosure should be analyzed within the widest range which is coherent with the principles and new features presented herein.

In the present disclosure, a network function and an artificial neural network and a neural network may be interchangeably used.

FIG. 1 is a conceptual view illustrating a basic semiconductor design process.

In order to design a semiconductor, netlist information which defines characteristics of the semiconductor devices and a connection relationship between devices is necessary. In the netlist information, the semiconductor devices are divided into macro cells having a relatively larger size and standard cells having a relatively smaller sizes. The macro cell does not have a separate specification for the size and is configured by millions of transistors to have a larger size than a normal standard cell. For example, the macro cell includes an SRAM or a CPU core. The standard cell refers to a small unit of device which is configured by one or more transistors and performs a basic function. The standard cell provides simple logical operations (for example, AND, OR, XOR) or a storage function such as flip-flops and sometimes provides more complex functions such as 2-bit full adders or multiple D-input flip-flops. Unlike the macro cell, the standard cell has a specification defined for the size.

The netlist information is considered as a set for nets representing the connectivity of semiconductor devices. The netlist information represents an attribute and a connection relationship of hundreds of macro cells and tens to millions of standard cells with a hypergraph structured data. The hypergraph is a graph in which one edge expresses a connection relationship with a plurality of nodes, unlike an ordinary graph in which one edge represents a connection relationship with two nodes. The net represents that each semiconductor device receives an electrical signal from which semiconductor device and transmits an electrical signal to which device.

Referring to FIG. 1, the process for designing a semiconductor is divided into three steps. First, a floorplan step 11 is performed to dispose a macro cell which is a device having a relatively larger size in an empty canvas. Next, a placement step 12 is performed to dispose a standard cell in a space of the canvas remaining after placing the macro cell. Finally, a routing step 13 is performed to physically connect the macro cell and the standard cell disposed in the canvas through a wire.

A metric called PPA evaluates whether a good design is performed by means of the processes as described above. PPA stands for power, performance, and area. According to the PPA, the semiconductor design aims to have a low production cost at a high integration degree in a small area with low power consumption and a high performance. In order to optimize the PPA according to this aim, a length of the wire which connects the semiconductor devices needs to be shortened. When the length of the wire which connects the devices is shortened, the arrival of the electrical signal may be accelerated. When the arrival of the electrical signal is accelerated, the performance of the semiconductor is inevitably improved. Further, the electrical signal is transmitted in a short time so that the power consumption is reduced. Further, when the overall use of the wire is reduced, the degree of integration is increased and an area occupied by the devices should be reduced.

According to the above-described point of view, it is considered to simply dispose all devices to be close for the good design. However, a routing resource which represents a resource allocating a wire is limited for every canvas so that it is practically impossible to simply dispose all devices to be close to each other. For example, if a wire already exists in a path through which another wire for connecting two devices passes, another wire for connecting two devices has no choice to bypass the wire to be disposed through another canvas area. In this case, the wire is bypassed so that the length of the wire is inevitably increased, which inevitably affects the placement of the wire for connecting subsequent devices. That is, a routing resource which is a resource which physically allocates the wire is limited in every area of the canvas so that if the devices are disposed without considering the routing resource, a bad design result is inevitable.

Accordingly, for the purpose of a good design, it is important to consider an overall connectivity including a standard cell from the floorplan step 11 in which macro cells having a relatively larger size and many connectivity are disposed. Currently, the floorplan step 11 is mainly manually performed by the engineers. For example, in the floorplan step 11, the macro cell is disposed by the intuition of the engineer. In many cases, the engineer mainly disposes the macro cell at the edge of the canvas to remain a center space for placement of the standard cell. After disposing the macro cell, the engineer disposes the standard cell using a function provided by an existing rule based tool. That is, the current logical design process of the semiconductor is performed considerably depending on the experience of the engineer. According to this method, it is practically very difficult to dispose the devices while keeping the connection relationship of several tens to millions of devices so that there is a problem in that a task performing speed or a quality of the result may vary depending on the skill level of the engineer.

Further, in some cases, the design processes 12 and 13 which follow the floorplan step 11 takes several days or more and when the quality of the final design result is not good, the subsequent processes 12 and 13 from the floorplan step 11 need to be performed again. Repeating this cycle several times may be very costly. Accordingly, a method which performs quick and accurate design and reduces the variation of the design quality from the logical design step of the semiconductor is necessary.

In the meantime, the result of the existing floorplan step 11 is measured using an exclusive electronic design automation (EDA) tool such as ICC2. In the process of evaluating a placement result after the floorplan step 11, the placement is evaluated by keeping the connection relationship of several tens to millions of devices in mind and all computations for every new placement need to be performed so that it takes a lot of time. Accordingly, a method for simplifying the process of evaluating the placement of the semiconductor device and reducing the problem complexity is necessary.

Hereinafter, the method of the present disclosure made based on the above-described problems will be described in detail with reference to FIGS. 2 to 17.

Figure 2:
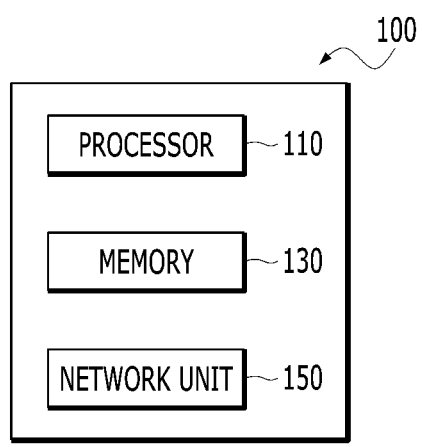
FIG. 2 is a block diagram of a computing device according to an exemplary embodiment of the present disclosure.

FIG. 2 is a block diagram of a computing device for automating a semiconductor design based on artificial intelligence according to the exemplary embodiment of the present disclosure.

A configuration of the computing device 100 illustrated in FIG. 2 is only an example shown through simplification. In an exemplary embodiment of the present disclosure, the computing device 100 may include other components for performing a computing environment of the computing device 100 and only some of the disclosed components may constitute the computing device 100. The computing device 100 may include a processor 110, a memory 130, and a network unit 150.

The processor 110 may be constituted by one or more cores and may include processors for data analysis and deep learning, which include a central processing unit (CPU), a general purpose graphics processing unit (GPGPU), a tensor processing unit (TPU), and the like of the computing device. The processor 110 may read a computer program stored in the memory 130 to perform data processing for machine learning according to an exemplary embodiment of the present disclosure. According to an exemplary embodiment of the present disclosure, the processor 110 may perform a calculation for learning the neural network. The processor 110 may perform calculations for learning the neural network, which include processing of input data for learning in deep learning (DL), extracting a feature in the input data, calculating an error, updating a weight of the neural network using backpropagation, and the like. At least one of the CPU, GPGPU, and TPU of the processor 110 may process learning of a network function. For example, both the CPU and the GPGPU may process the learning of the network function and data classification using the network function. Further, in an exemplary embodiment of the present disclosure, processors of a plurality of computing devices may be used together to process the learning of the network function and the data classification using the network function. Further, the computer program executed in the computing device according to an exemplary embodiment of the present disclosure may be a CPU, GPGPU, or TPU executable program.

According to the exemplary embodiment of the present disclosure, the processor 110 trains a neural network model for evaluating the placement of the semiconductor device.

For example, the processor 110 performs the clustering on the semiconductor devices and determines a reward for training the neural network model based on the clustering, based on connection information which represents a connection relationship between semiconductor devices. The connection information may be netlist information representing a connection relationship between semiconductor devices. The neural network model may perform the reinforcement learning in consideration of the reward determined based on the clustering which is performed on the semiconductor devices having a strong connectivity. The neural network model is trained to receive information about an attribute of the semiconductor device itself and the connection relationship of the semiconductor device to dispose the semiconductor device in the canvas and performs the reinforcement learning in consideration of the reward determined based on the clustering.

The processor 110 performs the clustering on the semiconductor devices based on the connection information as described above and determines the reward for training the neural network model. For example, the processor 110 performs the clustering to allow semiconductor devices having strong connectivity to be included in a cluster, based on the connection relationship between the semiconductor devices. The processor 110 assumes that the plurality of semiconductor devices included in the same cluster as one semiconductor device based on the clustering. The reward is determined based on one semiconductor device assumed as described above so that the processor 110 effectively improves the evaluation problems which are performed for the connection relationship of all the semiconductor device in every new placement by means of the trained neural network model.

According to an exemplary embodiment of the present disclosure, the memory 130 may include at least one type of storage medium of a flash memory type storage medium, a hard disk type storage medium, a multimedia card micro type storage medium, a card type memory (for example, an SD or XD memory, or the like), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk. The computing device 100 may operate in connection with a web storage performing a storing function of the memory 130 on the Internet. The description of the memory is just an example and the present disclosure is not limited thereto. The network unit 150 according to an exemplary embodiment of the present disclosure may use an arbitrary type known wired/wireless communication systems.

The network unit 150 receives information for evaluating the placement of the semiconductor device from the external system. For example, the network unit 150 may receive connection information indicating a connection relationship between the semiconductor devices from a semiconductor related database. At this time, the connection information received from the database may be learning data of the neural network model or inferring data. The connection information may include the information of the above-described example, but is not limited to the above-described example, and may be configured in various forms within a range that those skilled in the art understand.

The network unit 150 may transmit and receive information processed by the processor 110, a user interface, etc., through communication with the other terminal. For example, the network unit 150 may provide the user interface generated by the processor 110 to a client (e.g., a user terminal). Further, the network unit 150 may receive an external input of a user applied to the client and deliver the received external input to the processor 110. In this case, the processor 110 may process operations such as output, modification, change, addition, etc., of information provided through the user interface based on the external input of the user delivered from the network unit 150.

In the meantime, the computing device 100 according to the exemplary embodiment of the present disclosure is a computing system which transmits and receives information with the client, by means of communication and includes a server. At this time, the client may be an arbitrary form of a terminal accessible to the server. For example, the computing device 100 which serves as a server receives information for evaluating placement of the semiconductor device from the external database to generate an evaluation result and provides a user interface for the evaluation result to a user terminal. A user interface for the evaluation result may be provided to the user terminal. At this time, the user terminal outputs the user interface received from the computing device 100 which is a server and receives or processes the information by means of the interaction with the user.

In an additional exemplary embodiment, the computing device 100 may include an arbitrary type of terminal which receives a data resource generated in an arbitrary server to perform additional information processing.

Figure 3:
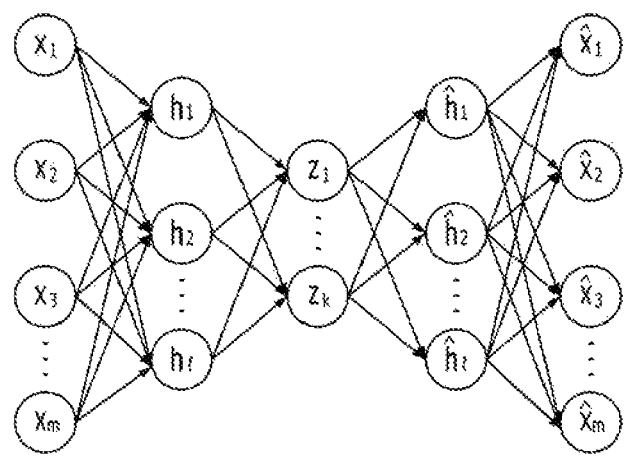
FIG. 3 is a conceptual view illustrating a neural network according to an exemplary embodiment of the present disclosure.

FIG. 3 is a conceptual view illustrating a neural network according to an exemplary embodiment of the present disclosure.

A neural network model according to the exemplary embodiment of the present disclosure may include a neural network for evaluating placement of the semiconductor device. Throughout the present specification, a computation model, the neural network, a network function, and the neural network may be used as the same meaning. The neural network may be generally constituted by an aggregate of calculation units which are mutually connected to each other, which may be called nodes. The nodes may also be called neurons. The neural network is configured to include one or more nodes. The nodes (alternatively, neurons) constituting the neural networks may be connected to each other by one or more links.

In the neural network, one or more nodes connected through the link may relatively form the relationship between an input node and an output node. Concepts of the input node and the output node are relative and a predetermined node which has the output node relationship with respect to one node may have the input node relationship in the relationship with another node and vice versa. As described above, the relationship of the input node to the output node may be generated based on the link. One or more output nodes may be connected to one input node through the link and vice versa.

In the relationship of the input node and the output node connected through one link, a value of data of the output node may be determined based on data input in the input node. Here, a link connecting the input node and the output node to each other may have a weight. The weight may be variable and the weight is variable by a user or an algorithm in order for the neural network to perform a desired function. For example, when one or more input nodes are mutually connected to one output node by the respective links, the output node may determine an output node value based on values input in the input nodes connected with the output node and the weights set in the links corresponding to the respective input nodes.

As described above, in the neural network, one or more nodes are connected to each other through one or more links to form a relationship of the input node and output node in the neural network. A characteristic of the neural network may be determined according to the number of nodes, the number of links, correlations between the nodes and the links, and values of the weights granted to the respective links in the neural network. For example, when the same number of nodes and links exist and there are two neural networks in which the weight values of the links are different from each other, it may be recognized that two neural networks are different from each other.

The neural network may be constituted by a set of one or more nodes. A subset of the nodes constituting the neural network may constitute a layer. Some of the nodes constituting the neural network may constitute one layer based on the distances from the initial input node. For example, a set of nodes of which distance from the initial input node is n may constitute n layers. The distance from the initial input node may be defined by the minimum number of links which should be passed through for reaching the corresponding node from the initial input node. However, a definition of the layer is predetermined for description and the order of the layer in the neural network may be defined by a method different from the aforementioned method. For example, the layers of the nodes may be defined by the distance from a final output node.

The initial input node may mean one or more nodes in which data is directly input without passing through the links in the relationships with other nodes among the nodes in the neural network. Alternatively, in the neural network, in the relationship between the nodes based on the link, the initial input node may mean nodes which do not have other input nodes connected through the links. Similarly thereto, the final output node may mean one or more nodes which do not have the output node in the relationship with other nodes among the nodes in the neural network. Further, a hidden node may mean nodes constituting the neural network other than the initial input node and the final output node.

In the neural network according to an exemplary embodiment of the present disclosure, the number of nodes of the input layer may be the same as the number of nodes of the output layer, and the neural network may be a neural network of a type in which the number of nodes decreases and then, increases again from the input layer to the hidden layer. Further, in the neural network according to another exemplary embodiment of the present disclosure, the number of nodes of the input layer may be smaller than the number of nodes of the output layer, and the neural network may be a neural network of a type in which the number of nodes decreases from the input layer to the hidden layer. Further, in the neural network according to yet another exemplary embodiment of the present disclosure, the number of nodes of the input layer may be larger than the number of nodes of the output layer, and the neural network may be a neural network of a type in which the number of nodes increases from the input layer to the hidden layer. The neural network according to still yet another exemplary embodiment of the present disclosure may be a neural network of a type in which the neural networks are combined.

A deep neural network (DNN) may refer to a neural network that includes a plurality of hidden layers in addition to the input and output layers. When the deep neural network is used, the latent structures of data may be determined. That is, latent structures of photos, text, video, voice, and music (e.g., what objects are in the photo, what the content and feelings of the text are, what the content and feelings of the voice are) may be determined. The deep neural network may include a convolutional neural network (CNN), a recurrent neural network (RNN), an auto encoder, generative adversarial networks (GAN), a restricted Boltzmann machine (RBM), a deep belief network (DBN), a Q network, a U network, a Siam network, a Generative Adversarial Network (GAN), and the like. The description of the deep neural network described above is just an example and the present disclosure is not limited thereto.

In an exemplary embodiment of the present disclosure, the network function may include the auto encoder. The auto encoder may be a kind of artificial neural network for outputting output data similar to input data. The auto encoder may include at least one hidden layer and odd hidden layers may be disposed between the input and output layers. The number of nodes in each layer may be reduced from the number of nodes in the input layer to an intermediate layer called a bottleneck layer (encoding), and then expanded symmetrical to reduction to the output layer (symmetrical to the input layer) in the bottleneck layer. The auto encoder may perform non-linear dimensional reduction. The number of input and output layers may correspond to a dimension after preprocessing the input data. The auto encoder structure may have a structure in which the number of nodes in the hidden layer included in the encoder decreases as a distance from the input layer increases. When the number of nodes in the bottleneck layer (a layer having a smallest number of nodes positioned between an encoder and a decoder) is too small, a sufficient amount of information may not be delivered, and as a result, the number of nodes in the bottleneck layer may be maintained to be a specific number or more (e.g., half of the input layers or more).

The neural network may be learned in at least one scheme of supervised learning, unsupervised learning, semi supervised learning, or reinforcement learning. The learning of the neural network may be a process in which the neural network applies knowledge for performing a specific operation to the neural network.

The neural network may be learned in a direction to minimize errors of an output. The learning of the neural network is a process of repeatedly inputting learning data into the neural network and calculating the output of the neural network for the learning data and the error of a target and back-propagating the errors of the neural network from the output layer of the neural network toward the input layer in a direction to reduce the errors to update the weight of each node of the neural network. In the case of the supervised learning, the learning data labeled with a correct answer is used for each learning data (i.e., the labeled learning data) and in the case of the unsupervised learning, the correct answer may not be labeled in each learning data. That is, for example, the learning data in the case of the supervised learning related to the data classification may be data in which category is labeled in each learning data. The labeled learning data is input to the neural network, and the error may be calculated by comparing the output (category) of the neural network with the label of the learning data. As another example, in the case of the unsupervised learning related to the data classification, the learning data as the input is compared with the output of the neural network to calculate the error. The calculated error is back-propagated in a reverse direction (i.e., a direction from the output layer toward the input layer) in the neural network and connection weights of respective nodes of each layer of the neural network may be updated according to the back propagation. A variation amount of the updated connection weight of each node may be determined according to a learning rate. Calculation of the neural network for the input data and the back-propagation of the error may constitute a learning cycle (epoch). The learning rate may be applied differently according to the number of repetition times of the learning cycle of the neural network. For example, in an initial stage of the learning of the neural network, the neural network ensures a certain level of performance quickly by using a high learning rate, thereby increasing efficiency and uses a low learning rate in a latter stage of the learning, thereby increasing accuracy.

In learning of the neural network, the learning data may be generally a subset of actual data (i.e., data to be processed using the learned neural network), and as a result, there may be a learning cycle in which errors for the learning data decrease, but the errors for the actual data increase. Overfitting is a phenomenon in which the errors for the actual data increase due to excessive learning of the learning data. For example, a phenomenon in which the neural network that learns a cat by showing a yellow cat sees a cat other than the yellow cat and does not recognize the corresponding cat as the cat may be a kind of overfitting. The over-fitting may act as a cause which increases the error of the machine learning algorithm. Various optimization methods may be used in order to prevent the overfitting. In order to prevent the overfitting, a method such as increasing the learning data, regularization, dropout of omitting a part of the node of the network in the process of learning, utilization of a batch normalization layer, etc., may be applied.

Figure 4:
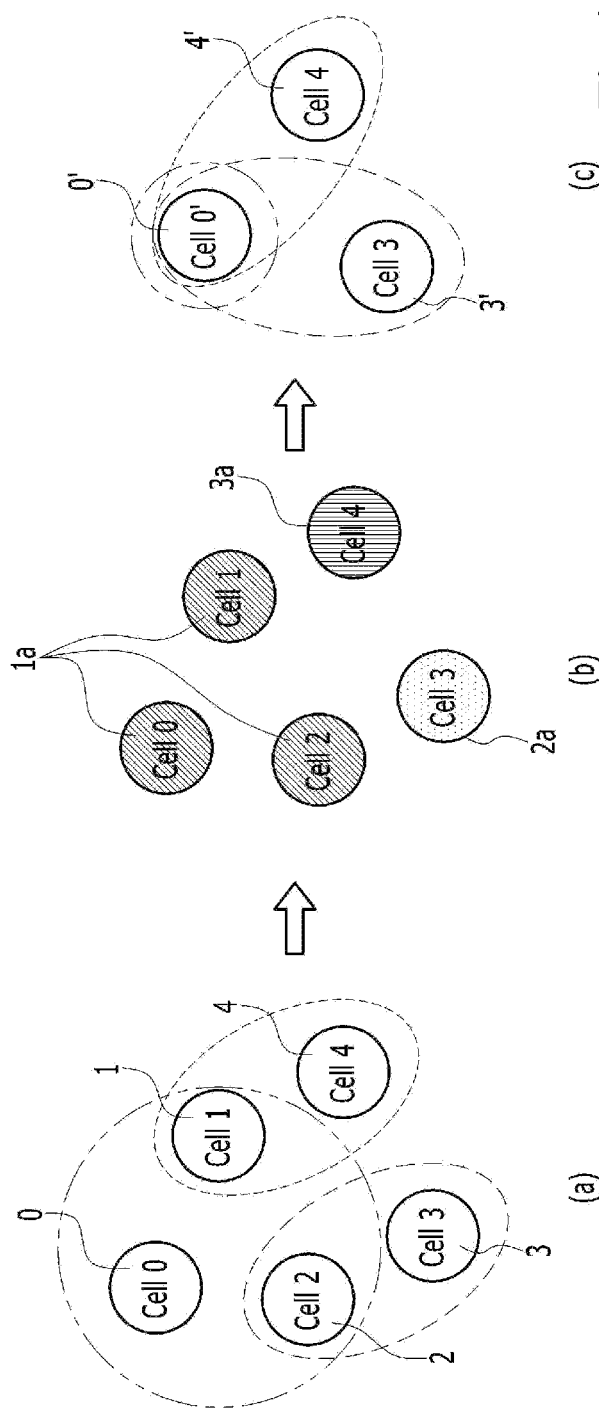
FIG. 4 is a conceptual view illustrating a process of determining a reward for training a neural network model based on clustering according to an exemplary embodiment of the present disclosure.
Figure 5:
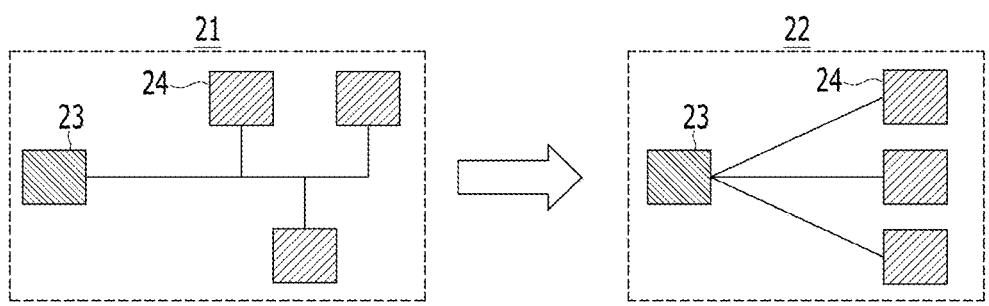
FIG. 5 is a conceptual view illustrating a preprocessing process for a clustering algorithm according to an exemplary embodiment of the present disclosure.

FIG. 4 is a conceptual view illustrating a process of determining a reward for training a neural network model based on clustering according to an exemplary embodiment of the present disclosure and FIG. 5 is a conceptual view illustrating a preprocessing process for a clustering algorithm according to an exemplary embodiment of the present disclosure.

According to the exemplary embodiment of the present disclosure, the processor 110 receives connection information representing a connection relationship between semiconductor devices. The connection information may be information about a net indicating a connectivity of semiconductor devices. The net is a wire defining a connectivity (connection relationship) of the semiconductor devices and indicates that each device receives an electrical signal from which device and transmits an electrical signal to which device. For example, referring to FIG. 4A, a first semiconductor device 0, a second semiconductor device 1, and a third semiconductor device 2 are connected to a first net Net1. A third semiconductor device 2 and a fourth semiconductor device 3 are connected to a second net Net2. The second semiconductor device 1 and the fifth semiconductor device 4 are connected to a third net Net3.

According to the exemplary embodiment of the present disclosure, the processor 110 performs the clustering on the semiconductor device based on connection information. Prior to clustering, the processor 110 performs the preprocessing to convert connection information with a hypergraph structure into an ordinary graph structure expressing the connection relationship between semiconductor devices one to one. The connection information representing the connection relationship between semiconductor devices may be data with a hypergraph structure. The hypergraph structure data is phenotype data of a many-to-many relationship so that the data itself has too complex structure to be analyzed. Accordingly, the processor 110 may preprocess the hypergraph structure connection information to be effectively processed by the clustering algorithm.

Specifically, the processor 110 converts the hypergraph structure connection information into the ordinary graph structure which expresses the connection relationship between the semiconductor devices one to one. For example, referring to FIG. 5, the processor 110 converts the connection information having a hypergraph structure 21 into connection information having an ordinary graph structure 22. The hypergraph structure 21 corresponds to a many-to-many structure in which a drive cell 23 corresponding to an input device and a load cell 24 corresponding to an output device are connected to one edge. In contrast, the ordinary graph structure 22 corresponds to a structure in which the drive cell 23 and the load cell 24 have an one-to-one relationship so that two devices are connected to one edge. That is, the processor 110 may convert netlist information of the hypergraph structure 21 into the ordinary graph structure 22 so that the drive cell 23 and the load cell 24 have one-to-one relationship. The processor 110 may perform the clustering using a state in which the connection information having an ordinary graph structure 22 generated by the conversion described above.

Even though in the drawing, only a small number of semiconductors device is illustrated for the convenience of description, the task of evaluating the placement of tens to millions of semiconductor devices has a high complexity. In order to simplify the evaluation for the placement of tens to millions of semiconductor devices, the processor 110 may cluster the semiconductor devices having strong connectivity. By assuming semiconductor devices included in the same cluster as one semiconductor devices by performing the clustering, the number of objects to be evaluated is reduced so that the problem complexity may be reduced.

FIG. 4B exemplarily illustrates a result of performing the clustering on the semiconductor devices, based on the connection information. For example, referring to FIG. 4B, a first cluster 1a includes the first semiconductor device 0, the second semiconductor device 1, and the third semiconductor device 2. The second cluster 2a includes the fourth semiconductor device 3. The third cluster 3a includes the fifth semiconductor device 4. The semiconductor devices included in the same cluster may be a group of semiconductor devices having a strong connectivity.

According to the exemplary embodiment of the present disclosure, the processor 110 may assume semiconductor devices included in the same cluster as one semiconductor device. For the convenience of description, one semiconductor device which is assumed from semiconductor devices included in the same cluster by the processor 110 is referred to as a temporary semiconductor device. FIG. 4C exemplarily illustrates a result obtained by assuming the plurality of semiconductor devices included in the same cluster as one semiconductor device based on the clustering. For example, referring to FIG. 4C, the processor 110 assumes the first semiconductor device 0, the second semiconductor device 1, and the third semiconductor device 2 included in the first cluster 1a as a first temporary semiconductor device 0'. The processor 110 assumes the fourth semiconductor device 3 included in the second cluster 2a as a second temporary semiconductor device 3'. The processor 110 assumes the fifth semiconductor device 4 included in the third cluster 3a as a third temporary semiconductor device 4'. The processor 110 determines a reward which is applied to the reinforcement learning of a neural network model based on the temporary semiconductor device which is assumed by this operation.

For example, the processor 110 performs an operation on a wire length and a congestion of the first temporary semiconductor device 0'. The first temporary semiconductor device 0' includes the first semiconductor device 0, the second semiconductor device 2, and the third semiconductor device 2 and the semiconductor devices included in the same cluster are assumed as one semiconductor device. Accordingly, the operation on the wire length and the congestion to determine the reward does not need to be repeatedly performed on the semiconductor devices included in the same cluster.

According to the exemplary embodiment of the present disclosure, the processor 110 may determine a reward to be returned to the reinforcement learning, based on one assumed semiconductor device. At this time, the reward may be determined based on at least one of a length of a wire which connects the semiconductor devices calculated in consideration of the semiconductor device assumed by the clustering or the congestion of the semiconductor devices calculated in consideration of the semiconductor device assumed through the clustering. For example, the reward may be calculated as a weighted sum of the wire length and the congestion. The reward which is calculated as the weighted sum of the wire length and the congestion calculated in consideration of the semiconductor device assumed through the clustering is expressed by the following Equation 1.

$$R_{nets} = -\alpha W(\text{nets}) - \beta C(\text{nets}) \quad \text{[Equation 1]}$$

Here, "nets" indicate a semiconductor device assumed by the clustering. $R_{net}$ is a reward, $\alpha$ and $\beta$ are coefficients for adjusting the entire scale, W(nets) is a length of a wire connecting semiconductor devices calculated in consideration of the semiconductor device assumed by the clustering, and C(nets) is a congestion connecting semiconductor devices calculated in consideration of the semiconductor device assumed by the clustering. As represented in Equation 1, the reward of the present disclosure may be derived by the weighted sum which flexibly adjusts a length of the wire and a magnitude of the congestion by the coefficients.

According to the exemplary embodiment of the present disclosure, the length of the wire may include a sum of a length of a wire calculated between the semiconductor device assumed by the clustering and the other external semiconductor devices and a fixed value of a length of the wire calculated between the semiconductor devices in the clustering. The length of the wire may be expressed by the following Equation 2.

$$\text{Wirelength}_{(nets)} = \Sigma \text{Wirelength}(\text{net}_{clustered}) + \Sigma \text{Wirelength}(\text{net}_{single\_clustered}) \quad \text{[Equation 2]}$$

Here, $\text{net}_{clustered}$ may be a relationship between the semiconductor device assumed by the clustering and the other external semiconductor devices. In other words, $\text{net}_{clustered}$ may be a case in which some of the plurality of semiconductor devices connected to a specific net is included in the cluster. $\text{net}_{single\_clustered}$ may be a relationship between semiconductor devices in the cluster. In other words, $\text{net}_{single\_clustered}$ may be a case in which all the semiconductor devices connected to a specific net are included in the one cluster. The fixed value of the wire length is always the same value regardless of the placement location of the semiconductor device so that it does not need to calculate the wire length again after initially calculating the wire length.

According to the exemplary embodiment of the present disclosure, the length of the wire may be calculated half the perimeter of the area in which devices having the connection relationship are disposed. For example, when it is assumed that there is one net (that is, devices which are completed to be disposed in a predetermined area of the canvas) which is completely disposed in one rectangular area, a half the perimeter of the rectangular area including the net is estimated as the length of the wire. The processor 110 may perform the above-described calculation on the semiconductor device assumed by the clustering and then estimate the entire sum as a length of the wire.

According to the exemplary embodiment of the present disclosure, the congestion may include a sum of the congestions calculated between the semiconductor device assumed by the clustering and the other external semiconductor devices and a fixed value of the congestion calculated between the semiconductor devices in the clustering. The congestion may be expressed represented by the following Equation 3.

$$\text{Congestion}_{(nets)} = \Sigma \text{Congestion}(\text{net}_{clustered}) + \Sigma \text{Congestion}(\text{net}_{single\_clustered}) \quad \text{[Equation 3]}$$

Here, $\text{net}_{clustered}$ may be a relationship between the semiconductor device assumed by the clustering and the other external semiconductor devices. In other words, $\text{net}_{clustered}$ may be a case in which some of the plurality of semiconductor devices connected to a specific net is included in the cluster. $\text{net}_{single\_clustered}$ may be a relationship between semiconductor devices in the cluster. In other words, $\text{net}_{single\_clustered}$ may be a case in which all the semiconductor devices connected to a specific net are included in the one cluster. The fixed value of the wire length is always the same value regardless of the placement location of the semiconductor device so that it does not need to calculate the wire length again after initially calculating the wire length. The fixed value of the wire length and the fixed value of the congestion always have the same value regardless of the placement location so that the fixed values do not need to be calculated again after the initial calculation.

According to the exemplary embodiment of the present disclosure, the congestion may be calculated by a ratio of a second routing resource which represents a demand resource for connecting the semiconductor devices disposed in the canvas by a wire to a first routing resource which represents a supply resource in which a wire is allocated for every area of the canvas. For example, the congestion may be expressed by the following Equation 4.

$$C(v) = \text{demand}(v)/\text{supply}(v) \quad \text{[Equation 4]}$$

Here, v is a grid cell which is a basic unit of the canvas area. C(v) represents a congestion, supply(v) represents a first routing resource provided by the grid cell of the canvas, and demand(v) represents a second routing resource demanded to connect semiconductor devices by a wire. According to Equation 4, the congestion is proportional to the second routing resource so that it is expected that the second routing resource is reduced to lower the entire congestion.

The computing process of estimating the above-described congestion will be described in more detail with reference to FIGS. 6 to 14.

Figure 6:
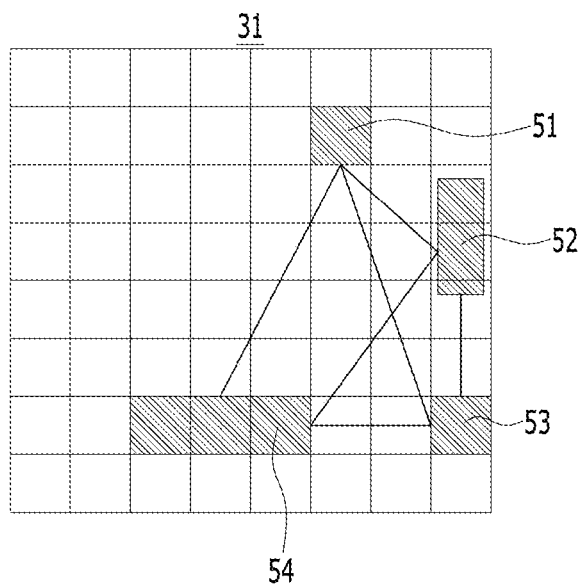
Figure 7:
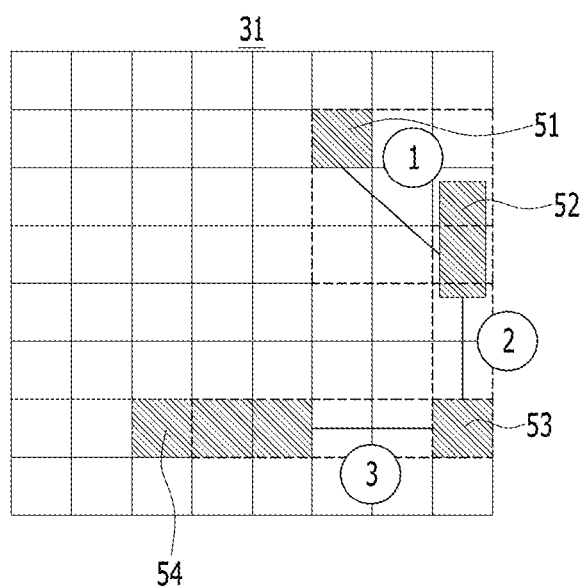

The processor 110 according to the exemplary embodiment of the present disclosure generates a complete graph representing a state in which all the semiconductor devices disposed in the canvas are connected to each other by an action. The processor 110 may convert the complete graph into a minimum spanning tree. The processor 110 may express all the devices to be directly and indirectly connected to each other with a minimum number of edges by converting the connection relationship of the complete graph into the minimum spanning tree. When the PPA is considered, it is possible to assume that a final routing result corresponding to a physical design of the semiconductor devices approximately follow the shape of the minimum spanning tree. So that the processor 110 converts the complete graph into the minimum spanning tree to estimate the congestion. For example, when four semiconductor devices 51, 52, 53, and 54 are disposed in the canvas through an action, the processor 110 may generate a complete graph which connects all four semiconductor devices 51, 52, 53, and 54 as illustrated in FIG. 6. As illustrated in FIG. 7, the processor 110 may convert the complete connection graph into a minimum spanning tree. Here, the minimum spanning tree is understood as a graph that connects all four semiconductor devices 51, 52, 53, and 54 and minimizes the number of edges and the length of the edges.

The processor 110 may compute the routing resource for each of edges which configure the minimum spanning tree. Here, the routing resource is understood as a resource demanded to connect devices whose connection relationship is defined as an edge. Specifically, the processor 110 may compute a number of cases for connecting the semiconductor devices by the wire in the canvas in consideration of the placement of the semiconductor devices corresponding to the node of the edge. The processor 110 calculates an expectation for a shape of a wire to be disposed in the canvas for every grid cell in consideration of each of the number of cases. At this time, the expectation for the shape of the wire to be disposed in the canvas may include a first expectation that the wire is vertically disposed in the grid cell of the canvas and a second expectation that the wire is horizontally disposed in the grid cell of the canvas. The processor 110 may compute the routing resource for each edge based on the computed number of cases and the calculated expectation.

For example, referring to FIG. 7, the processor 110 may divide an area of the grid cell required to calculate the routing resource of each of three edges which configure the minimum spanning tree into an area (1), an area (2), and an area (3). The processor 110 may calculate a routing resource for each of three edges with respect to each area. That is, the processor 110 may calculate the routing resource demanded for connection of the devices whose connection relationship is defined as an edge, with respect to each of the area (1), the area (2), and the area (3).

Figure 8:
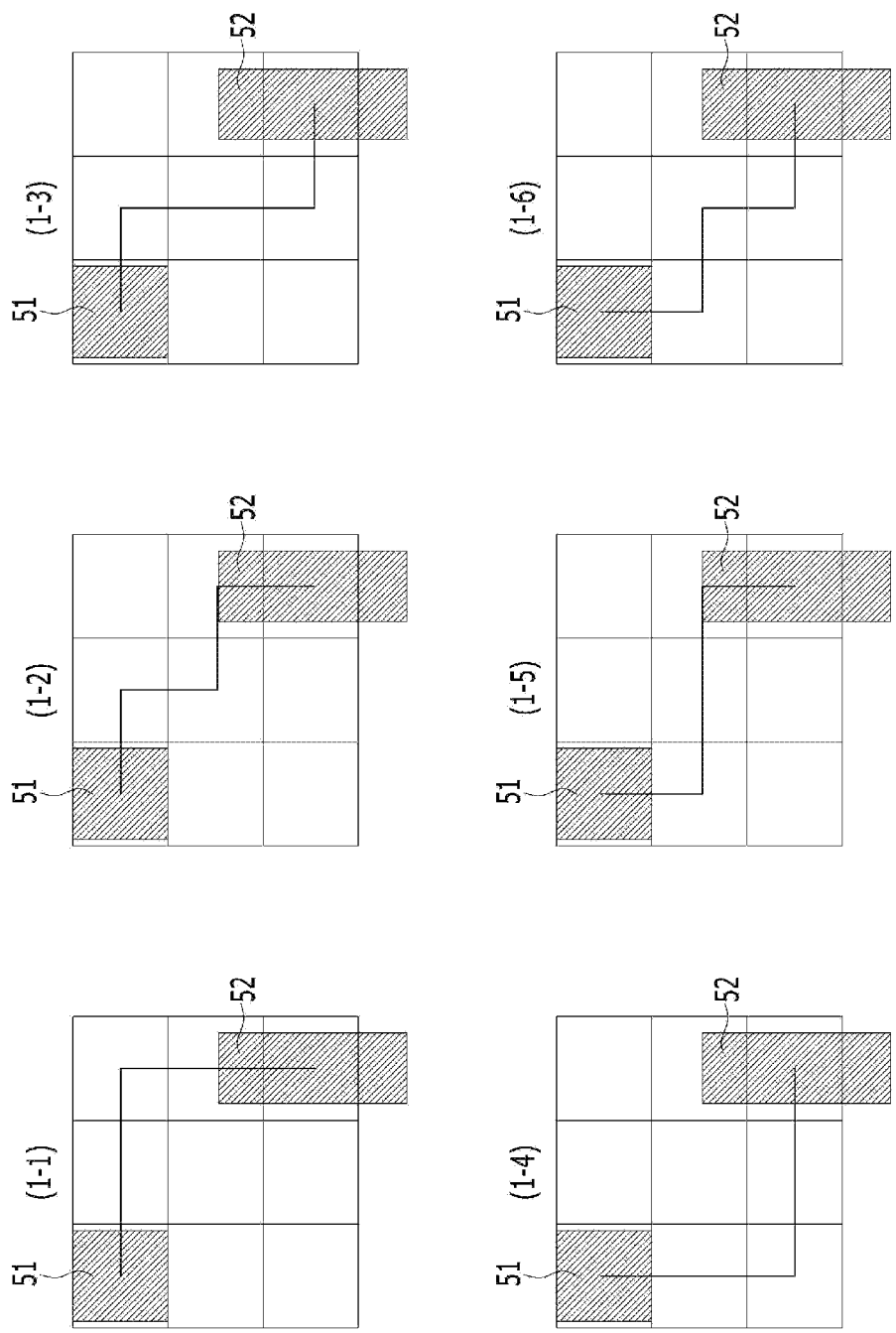
Figure 9:
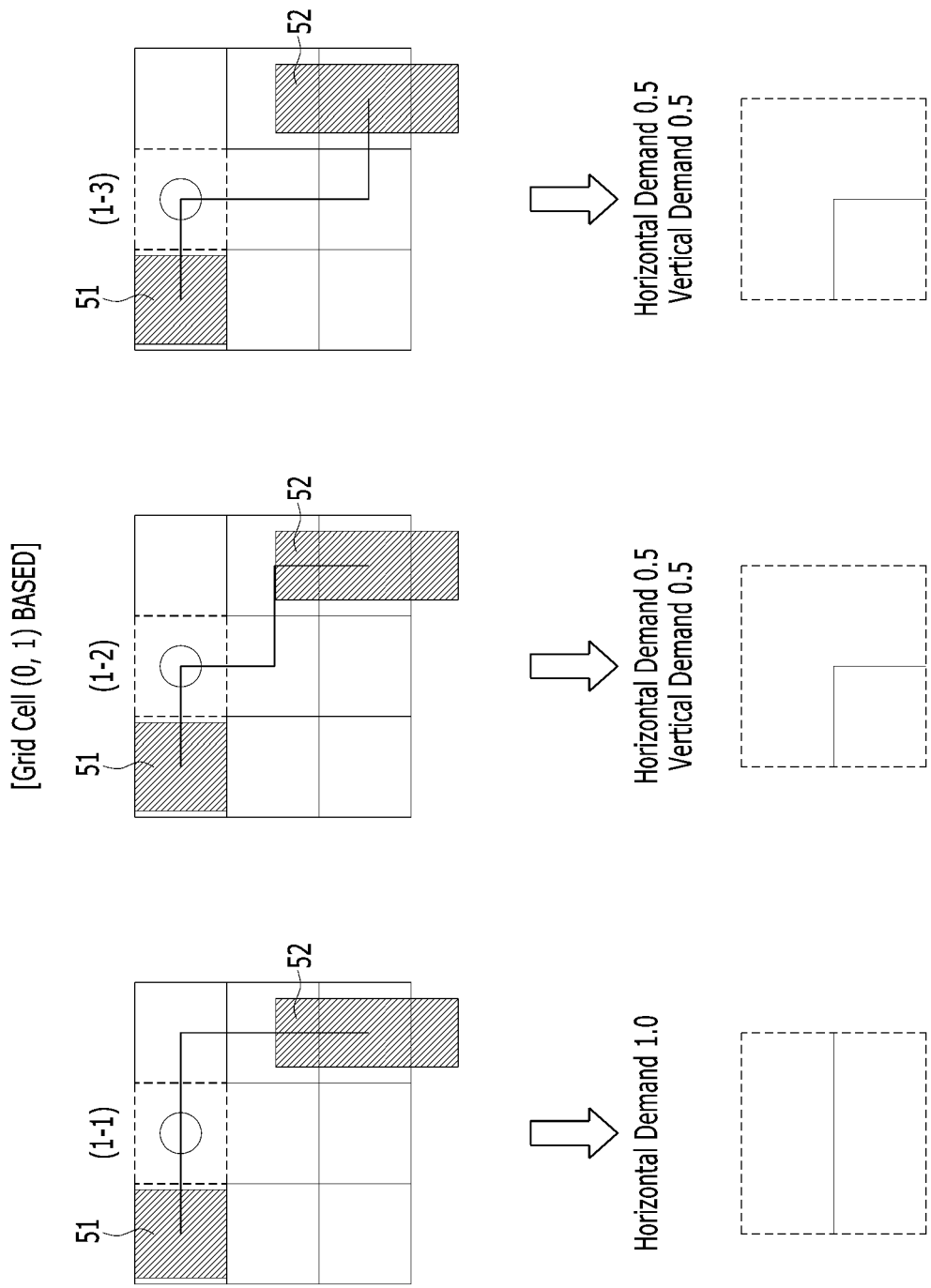
Figure 10:
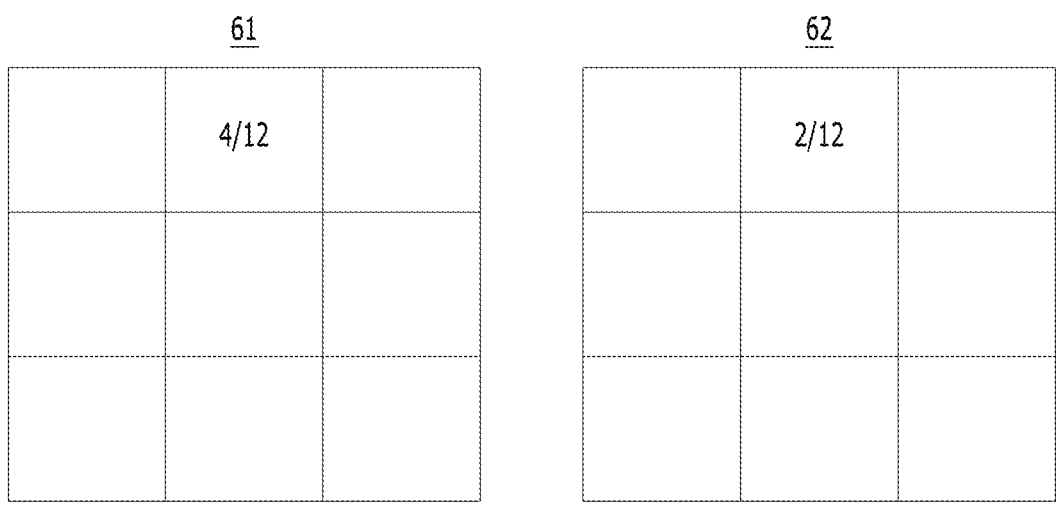
Figure 11:
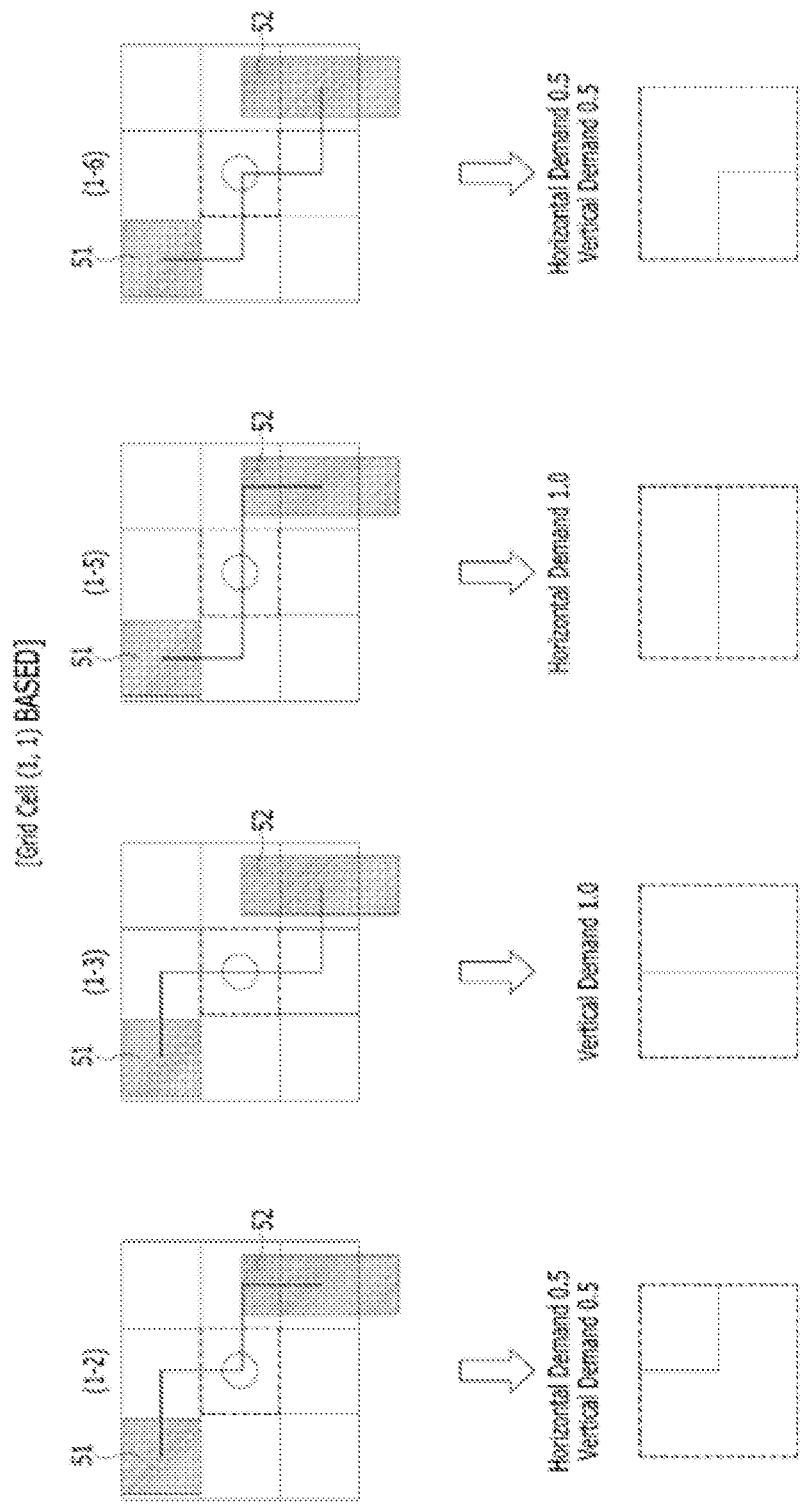

Referring to the area (1), the number of cases of connecting two devices 51 and 52 in the area (1) by a wire is six from (1-1) to (1-6) as illustrated in FIG. 8. That is, the processor 110 may calculate the number of cases for physically connecting the devices with respect to the area (1) as 6. Further, the processor 110 may calculate an expectation for a shape of the wire to be individually disposed in the canvas with respect to the grid cells which configures the area (1). Referring to FIG. 9, in the case of the grid cell (0,1), the number of cases for connecting two devices 51 and 52 corresponds to (1-1), (1-2), and (1-3). Accordingly, with respect to the grid cell (0,1), the processor 110 may calculate a first expectation that the wire is vertically disposed and a second expectation that the wire is horizontally disposed in consideration of three cases of (1-1), (1-2), and (1-3). The processor 110 may calculate a result of adding by computing a product of a probability of selecting each of three cases and a routing resource for a shape of the wire to be disposed in the grid cell (0,1) according to three cases as a first expectation and a second expectation. At this time, the probability of selecting each of three cases is a probability of arbitrary selecting one of six paths for connecting two devices 51 and 52 with respect to the area (1), that is, $1/6$. Accordingly, the first expectation may be calculated to be $(1/6*1.0)+(1/6*0.5)+(1/6*0.5)=4/12$. Further, the second expectation may be calculated to be $(0)+(1/6*0.5)+(1/6*0.5)=2/12$. The processor 110 stores the first expectation and the second expectation calculated with respect to the grid cell (0,1) in a position (0,1) of a first expectation map 61 and a second expectation map 62 with respect to the area (1) as illustrated in FIG. 10.

Referring to FIG. 9, in the case of the grid cell (1,1), the number of cases for connecting two devices 51 and 52 corresponds to (1-2), (1-3), (1-5), and (1-6). Accordingly, with respect to the grid cell (1,1), the processor 110 may calculate a first expectation that the wire is vertically disposed and a second expectation that the wire is horizontally disposed in consideration of four cases of (1-2), (1-3), (1-5), and (1-6). The processor 110 may calculate a result of adding by computing a product of a probability of selecting each of four cases and a routing resource for a shape of the wire to be disposed in the grid cell (1,1) according to three cases as a first expectation and a second expectation. At this time, the probability of selecting each of four cases is a probability of arbitrary selecting one of six paths for connecting two devices 51 and 52 with respect to the area (1), that is, $1/6$. Accordingly, the first expectation may be calculated to be $(1/6*0.5)+(0)+(1/6*1.0)+(1/6*0.5)=4/12$. Accordingly, the second expectation may be calculated to be $(1/6*0.5)\pm(1/6*1.0)\pm(0)+(1/6*0.5)=4/12$. The processor 110 stores the first expectation and the second expectation calculated with respect to the grid cell (1,1) in a position (1,1) of a first expectation map 61 and a second expectation map 62 with respect to the area (1) as illustrated in FIG. 13.

The processor 110 performs the computation on all the grid cells of the area (1) to store the expectations for both the first expectation map 61 and the second expectation map 62 as illustrated in FIG. 13. Further, the processor 110 performs the computation as described in the example not only on the area (1), but also on the area (2) and the area (3) to generate the first expectation map and the second expectation map for all three areas with edges. At this time, the first expectation map and the second expectation map of each area may correspond to the routing resource of each edge.

The processor 110 calculates a cumulative sum of the routing resources of the edges and estimates the congestion based on the result value derived by the cumulative sum. Specifically, the processor 110 estimates the second routing resources by averaging values of upper N % (N is a natural number) among result values derived from the cumulative sum. The processor 110 calculates a ratio to the first routing resource using the estimated second routing resource and estimates the congestion. The processor 110 reflects values of upper N % for the cumulative sum of the edge routing resource to estimate the congestion to suppress the very high second routing resource from appearing in a specific area of the canvas. That is, the processor 110 uniformly distributes the second routing resources in all the canvas area to appropriately reflect the congestion for the entire canvas area to the reward.

Figure 14:
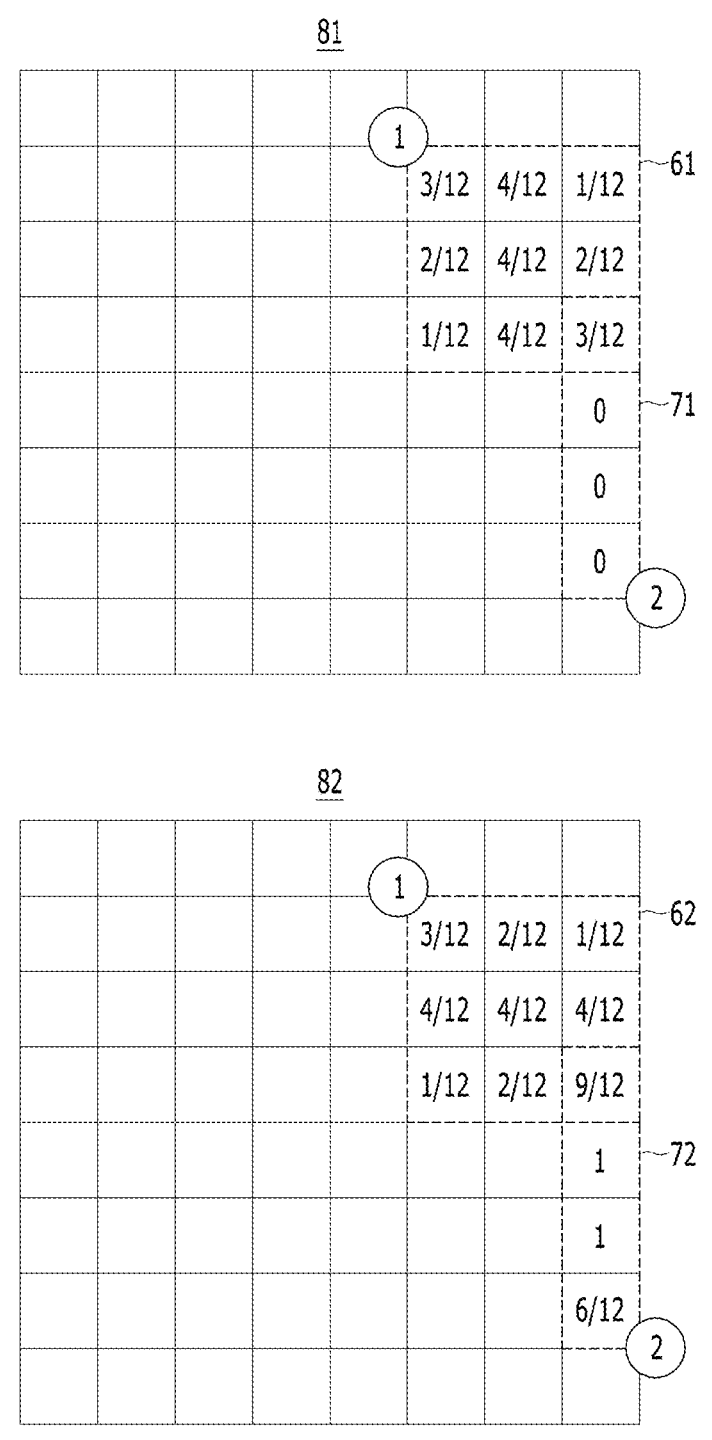

For example, referring to FIG. 14, the processor 110 may reflect the first expectation map and the second expectation map generated for all three areas with the edge to the global map (81, 82) representing the entire canvas area. In the process of reflecting each expectation, the processor 110 performs the cumulative sum for the area in which each expectation map overlaps. That is, the expectations of the grid cell (3,7) in which the expectation map (61,62) of the area (1) and the expectation map (71,72) of the area (2) overlap are added to be stored in the global map (81, 82) as $3/12$ and $9/12$. As described above, the processor 110 updates the global map (81, 82) for all edge areas and averages all values of the highest 10% to utilize an estimation of the congestion.

Figure 15:
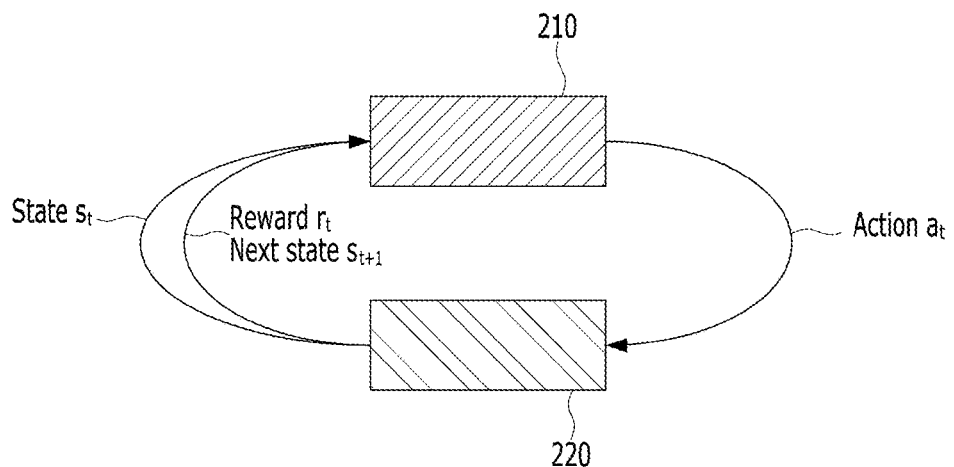
FIG. 15 is a conceptual view illustrating a reinforcement learning process.

FIG. 15 is a conceptual view for explaining a reinforcement learning process of a neural network model according to an exemplary embodiment of the present disclosure.

The reinforcement learning is a learning method which trains the neural network model based on a reward calculated for an action selected by the neural network model to allow the l neural network model to determine a better action based on state. The state is a set of values representing how the situation is at the current timing and is understood as an input of the neural network model. The action refers to a decision according to an option to be taken by the neural network model and is understood as an output of the neural network model. The reward refers to a benefit followed when the neural network model performs any action and represents an immediate value for evaluating the current state and the action. The reinforcement learning is understood as learning through trial and error because the decision (that is, action) is rewarded. A reward given to the neural network model during the reinforcement learning process, may be a reward obtained by accumulating results of a plurality of actions. A neural network model which makes the return such as a reward itself or a total of rewards maximum in consideration of the reward according to several states and actions may be generated by the reinforcement learning. In the present disclosure, the neural network model may be interchangeably used with a term "agent" which is a subject that makes a decision on what action to take according to the surrounding state. Referring to FIG. 15, in the reinforcement learning, there is an environment 220 to which the agent 210 belongs. The environment 220 may be understood to indicate the setting itself for the reinforcement learning of the agent 210. When the agent 210 acts, the state is changed by the environment 220, and the agent 210 may be rewarded. A goal of the reinforcement learning is to train the agent 210 to get as many rewards as possible in the given environment 220.

According to the exemplary embodiment of the present disclosure, the reward may be determined based on one semiconductor device assumed for a plurality of semiconductor devices included in the same cluster based on the clustering. The processor 110 may perform the reinforcement learning in consideration of the reward described above with respect to FIGS. 5 to 14.

According to the exemplary embodiment of the present disclosure, the processor 110 may train the neural network model by means of the reinforcement learning based on a state which includes connection information representing a connection relationship between semiconductor devices, an action that disposes the semiconductor device in the canvas, and a reward determined by the process as described above. The processor 110 causes the neural network model to perform the action to dispose one semiconductor device per one cycle in the canvas and returns the reward according to the action together with the state to allow the neural network model to perform the action according to a next cycle to perform the reinforcement learning for the neural network model. For example, the processor 110 may perform the action at a specific timing t to dispose the semiconductor device in the canvas based on the state at the specific timing t, through the neural network model. The processor 110 estimates a reward at a next timing t+1 for the action at the specific timing t and returns the estimated reward to the neural network model. The processor 110 performs the action at the next timing t+1 by inputting the state and the reward at the next timing t+1 to the neural network model as an input. The processor 110 repeats the cycle to perform the reinforcement learning for the neural network model to optimize the PPA which is an evaluation index of the logical design of the semiconductor.

Figure 16:
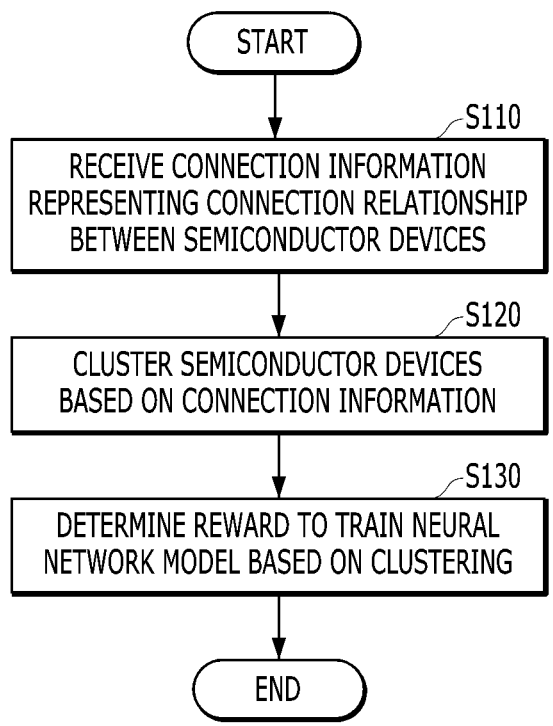
FIG. 16 is a flowchart illustrating a method for evaluating placement of semiconductor devices according to an exemplary embodiment of the present disclosure.

FIG. 16 is a flowchart illustrating a method for evaluating placement of semiconductor devices according to an exemplary embodiment of the present disclosure.

Referring to FIG. 16, the computing device 100 according to the exemplary embodiment of the present disclosure receives connection information representing a connection relationship between semiconductor devices from an external system (S110). The external system may be a server or a database which stores and manages the connection information representing the connection relationship between semiconductor devices. The computing device 100 uses information received from the external system as data for determining a reward to train the neural network model.

The computing device 100 performs the clustering on the semiconductor devices based on the connection information (S120).

The computing device 100 determines a reward for training the neural network model based on the clustering performed through the step S120 (S130). At this time, the learning of the neural network model may be performed based on the reinforcement learning. The computing device 100 determines in advance the reward of the semiconductor device based on the clustering prior to the reinforcement learning to significantly increase an approximation speed while minimizing loss of the connection information between semiconductor devices.

Disclosed is a computer readable medium storing the data structure according to an exemplary embodiment of the present disclosure.

The data structure may refer to the organization, management, and storage of data that enables efficient access to and modification of data. The data structure may refer to the organization of data for solving a specific problem (e.g., data search, data storage, data modification in the shortest time). The data structures may be defined as physical or logical relationships between data elements, designed to support specific data processing functions. The logical relationship between data elements may include a connection between data elements that the user defines. The physical relationship between data elements may include an actual relationship between data elements physically stored on a computer-readable storage medium (e.g., persistent storage device). The data structure may specifically include a set of data, a relationship between the data, a function which may be applied to the data, or instructions. Through an effectively designed data structure, a computing device can perform operations while using the resources of the computing device to a minimum. Specifically, the computing device can increase the efficiency of operation, read, insert, delete, compare, exchange, and search through the effectively designed data structure.

The data structure may be divided into a linear data structure and a non-linear data structure according to the type of data structure. The linear data structure may be a structure in which only one data is connected after one data. The linear data structure may include a list, a stack, a queue, and a deque. The list may mean a series of data sets in which an order exists internally. The list may include a linked list. The linked list may be a data structure in which data is connected in a scheme in which each data is linked in a row with a pointer. In the linked list, the pointer may include link information with next or previous data. The linked list may be represented as a single linked list, a double linked list, or a circular linked list depending on the type. The stack may be a data listing structure with limited access to data. The stack may be a linear data structure that may process (e.g., insert or delete) data at only one end of the data structure. The data stored in the stack may be a data structure (LIFO-Last in First Out) in which the data is input last and output first. The queue is a data listing structure that may access data limitedly and unlike a stack, the queue may be a data structure (FIFO-First in First Out) in which late stored data is output late. The deque may be a data structure capable of processing data at both ends of the data structure.

The non-linear data structure may be a structure in which a plurality of data are connected after one data. The non-linear data structure may include a graph data structure. The graph data structure may be defined as a vertex and an edge, and the edge may include a line connecting two different vertices. The graph data structure may include a tree data structure. The tree data structure may be a data structure in which there is one path connecting two different vertices among a plurality of vertices included in the tree. That is, the tree data structure may be a data structure that does not form a loop in the graph data structure.

The data structure may include the neural network. In addition, the data structures, including the neural network, may be stored in a computer readable medium. The data structure including the neural network may also include data preprocessed for processing by the neural network, data input to the neural network, weights of the neural network, hyper parameters of the neural network, data obtained from the neural network, an active function associated with each node or layer of the neural network, and a loss function for learning the neural network. The data structure including the neural network may include predetermined components of the components disclosed above. In other words, the data structure including the neural network may include all of data preprocessed for processing by the neural network, data input to the neural network, weights of the neural network, hyper parameters of the neural network, data obtained from the neural network, an active function associated with each node or layer of the neural network, and a loss function for learning the neural network or a combination thereof. In addition to the above-described configurations, the data structure including the neural network may include predetermined other information that determines the characteristics of the neural network. In addition, the data structure may include all types of data used or generated in the calculation process of the neural network, and is not limited to the above. The computer readable medium may include a computer readable recording medium and/or a computer readable transmission medium. The neural network may be generally constituted by an aggregate of calculation units which are mutually connected to each other, which may be called nodes. The nodes may also be called neurons. The neural network is configured to include one or more nodes.

The data structure may include data input into the neural network. The data structure including the data input into the neural network may be stored in the computer readable medium. The data input to the neural network may include learning data input in a neural network learning process and/or input data input to a neural network in which learning is completed. The data input to the neural network may include preprocessed data and/or data to be preprocessed. The preprocessing may include a data processing process for inputting data into the neural network. Therefore, the data structure may include data to be preprocessed and data generated by preprocessing. The data structure is just an example and the present disclosure is not limited thereto.

The data structure may include the weight of the neural network (in the present disclosure, the weight and the parameter may be used as the same meaning). In addition, the data structures, including the weight of the neural network, may be stored in the computer readable medium. The neural network may include a plurality of weights. The weight may be variable and the weight is variable by a user or an algorithm in order for the neural network to perform a desired function. For example, when one or more input nodes are mutually connected to one output node by the respective links, the output node may determine a data value output from an output node based on values input in the input nodes connected with the output node and the weights set in the links corresponding to the respective input nodes. The data structure is just an example and the present disclosure is not limited thereto.

As a non-limiting example, the weight may include a weight which varies in the neural network learning process and/or a weight in which neural network learning is completed. The weight which varies in the neural network learning process may include a weight at a time when a learning cycle starts and/or a weight that varies during the learning cycle. The weight in which the neural network learning is completed may include a weight in which the learning cycle is completed. Accordingly, the data structure including the weight of the neural network may include a data structure including the weight which varies in the neural network learning process and/or the weight in which neural network learning is completed. Accordingly, the above-described weight and/or a combination of each weight are included in a data structure including a weight of a neural network. The data structure is just an example and the present disclosure is not limited thereto.

The data structure including the weight of the neural network may be stored in the computer-readable storage medium (e.g., memory, hard disk) after a serialization process. Serialization may be a process of storing data structures on the same or different computing devices and later reconfiguring the data structure and converting the data structure to a form that may be used. The computing device may serialize the data structure to send and receive data over the network. The data structure including the weight of the serialized neural network may be reconfigured in the same computing device or another computing device through deserialization. The data structure including the weight of the neural network is not limited to the serialization. Furthermore, the data structure including the weight of the neural network may include a data structure (for example, B-Tree, Trie, m-way search tree, AVL tree, and Red-Black Tree in a nonlinear data structure) to increase the efficiency of operation while using resources of the computing device to a minimum. The above-described matter is just an example and the present disclosure is not limited thereto.

The data structure may include hyper-parameters of the neural network. In addition, the data structures, including the hyper-parameters of the neural network, may be stored in the computer readable medium. The hyper-parameter may be a variable which may be varied by the user. The hyper-parameter may include, for example, a learning rate, a cost function, the number of learning cycle iterations, weight initialization (for example, setting a range of weight values to be subjected to weight initialization), and Hidden Unit number (e.g., the number of hidden layers and the number of nodes in the hidden layer). The data structure is just an example and the present disclosure is not limited thereto.

Figure 17:
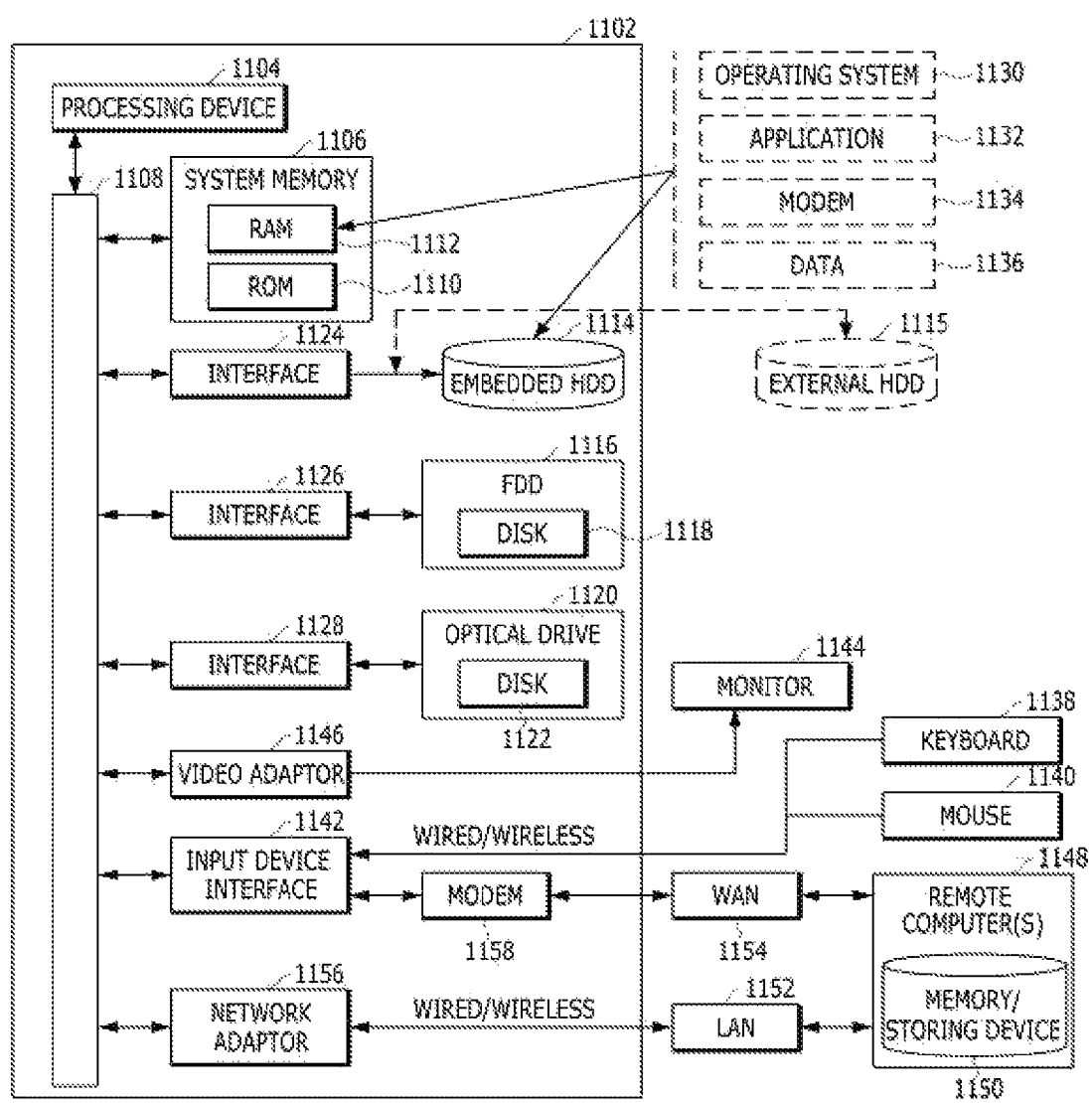
FIG. 17 is a conceptual view of a computing environment according to an exemplary embodiment of the present disclosure.

FIG. 17 is a normal and schematic view of an exemplary computing environment in which the exemplary embodiments of the present disclosure may be implemented.

It is described above that the present disclosure may be generally implemented by the computing device, but those skilled in the art will well know that the present disclosure may be implemented in association with a computer executable command which may be executed on one or more computers and/or in combination with other program modules and/or a combination of hardware and software.

In general, the program module includes a routine, a program, a component, a data structure, and the like that execute a specific task or implement a specific abstract data type. Further, it will be well appreciated by those skilled in the art that the method of the present disclosure can be implemented by other computer system configurations including a personal computer, a handheld computing device, microprocessor-based or programmable home appliances, and others (the respective devices may operate in connection with one or more associated devices as well as a single-processor or multi-processor computer system, a mini computer, and a main frame computer.

The exemplary embodiments described in the present disclosure may also be implemented in a distributed computing environment in which predetermined tasks are performed by remote processing devices connected through a communication network. In the distributed computing environment, the program module may be positioned in both local and remote memory storage devices.

The computer generally includes various computer readable media. Media accessible by the computer may be computer readable media regardless of types thereof and the computer readable media include volatile and non-volatile media, transitory and non-transitory media, and mobile and non-mobile media. As a non-limiting example, the computer readable media may include both computer readable storage media and computer readable transmission media. The computer readable storage media include volatile and non-volatile media, transitory and non-transitory media, and mobile and non-mobile media implemented by a predetermined method or technology for storing information such as a computer readable instruction, a data structure, a program module, or other data. The computer readable storage media include a RAM, a ROM, an EEPROM, a flash memory or other memory technologies, a CD-ROM, a digital video disk (DVD) or other optical disk storage devices, a magnetic cassette, a magnetic tape, a magnetic disk storage device or other magnetic storage devices or predetermined other media which may be accessed by the computer or may be used to store desired information, but are not limited thereto.

The computer readable transmission media generally implement the computer readable command, the data structure, the program module, or other data in a carrier wave or a modulated data signal such as other transport mechanism and include all information transfer media. The term "modulated data signal" means a signal acquired by setting or changing at least one of characteristics of the signal so as to encode information in the signal. As a non-limiting example, the computer readable transmission media include wired media such as a wired network or a direct-wired connection and wireless media such as acoustic, RF, infrared and other wireless media. A combination of any media among the aforementioned media is also included in a range of the computer readable transmission media.

An exemplary environment 1100 that implements various aspects of the present disclosure including a computer 1102 is shown and the computer 1102 includes a processing device 1104, a system memory 1106, and a system bus 1108. The system bus 1108 connects system components including the system memory 1106 (not limited thereto) to the processing device 1104. The processing device 1104 may be a predetermined processor among various commercial processors. A dual processor and other multi-processor architectures may also be used as the processing device 1104.

The system bus 1108 may be any one of several types of bus structures which may be additionally interconnected to a local bus using any one of a memory bus, a peripheral device bus, and various commercial bus architectures. The system memory 1106 includes a read only memory (ROM) 1110 and a random access memory (RAM) 1112. A basic input/output system (BIOS) is stored in the non-volatile memories 1110 including the ROM, the EPROM, the EEPROM, and the like and the BIOS includes a basic routine that assists in transmitting information among components in the computer 1102 at a time such as in-starting. The RAM 1112 may also include a high-speed RAM including a static RAM for caching data, and the like.

The computer 1102 also includes an interior hard disk drive (HDD) 1114 (for example, EIDE and SATA), in which the interior hard disk drive 1114 may also be configured for an exterior purpose in an appropriate chassis (not illustrated), a magnetic floppy disk drive (FDD) 1116 (for example, for reading from or writing in a mobile diskette 1118), and an optical disk drive 1120 (for example, for reading a CD-ROM disk 1122 or reading from or writing in other high-capacity optical media such as the DVD, and the like). The hard disk drive 1114, the magnetic disk drive 1116, and the optical disk drive 1120 may be connected to the system bus 1108 by a hard disk drive interface 1124, a magnetic disk drive interface 1126, and an optical drive interface 1128, respectively. An interface 1124 for implementing an exterior drive includes at least one of a universal serial bus (USB) and an IEEE 1394 interface technology or both of them.

The drives and the computer readable media associated therewith provide non-volatile storage of the data, the data structure, the computer executable instruction, and others. In the case of the computer 1102, the drives and the media correspond to storing of predetermined data in an appropriate digital format. In the description of the computer readable media, the mobile optical media such as the HDD, the mobile magnetic disk, and the CD or the DVD are mentioned, but it will be well appreciated by those skilled in the art that other types of media readable by the computer such as a zip drive, a magnetic cassette, a flash memory card, a cartridge, and others may also be used in an exemplary operating environment and further, the predetermined media may include computer executable commands for executing the methods of the present disclosure.

Multiple program modules including an operating system 1130, one or more application programs 1132, other program module 1134, and program data 1136 may be stored in the drive and the RAM 1112. All or some of the operating system, the application, the module, and/or the data may also be cached in the RAM 1112. It will be well appreciated that the present disclosure may be implemented in operating systems which are commercially usable or a combination of the operating systems.

A user may input instructions and information in the computer 1102 through one or more wired/wireless input devices, for example, pointing devices such as a keyboard 1138 and a mouse 1140. Other input devices (not illustrated) may include a microphone, an IR remote controller, a joystick, a game pad, a stylus pen, a touch screen, and others.

These and other input devices are often connected to the processing device 1104 through an input device interface 1142 connected to the system bus 1108, but may be connected by other interfaces including a parallel port, an IEEE 1394 serial port, a game port, a USB port, an IR interface, and others.

A monitor 1144 or other types of display devices are also connected to the system bus 1108 through interfaces such as a video adapter 1146, and the like. In addition to the monitor 1144, the computer generally includes other peripheral output devices (not illustrated) such as a speaker, a printer, others.

The computer 1102 may operate in a networked environment by using a logical connection to one or more remote computers including remote computer(s) 1148 through wired and/or wireless communication. The remote computer(s) 1148 may be a workstation, a computing device computer, a router, a personal computer, a portable computer, a micro-processor based entertainment apparatus, a peer device, or other general network nodes and generally includes multiple components or all of the components described with respect to the computer 1102, but only a memory storage device 1150 is illustrated for brief description. The illustrated logical connection includes a wired/wireless connection to a local area network (LAN) 1152 and/or a larger network, for example, a wide area network (WAN) 1154. The LAN and WAN networking environments are general environments in offices and companies and facilitate an enterprise-wide computer network such as Intranet, and all of them may be connected to a worldwide computer network, for example, the Internet.

When the computer 1102 is used in the LAN networking environment, the computer 1102 is connected to a local network 1152 through a wired and/or wireless communication network interface or an adapter 1156. The adapter 1156 may facilitate the wired or wireless communication to the LAN 1152 and the LAN 1152 also includes a wireless access point installed therein in order to communicate with the wireless adapter 1156. When the computer 1102 is used in the WAN networking environment, the computer 1102 may include a modem 1158 or has other means that configure communication through the WAN 1154 such as connection to a communication computing device on the WAN 1154 or connection through the Internet. The modem 1158 which may be an internal or external and wired or wireless device is connected to the system bus 1108 through the serial port interface 1142. In the networked environment, the program modules described with respect to the computer 1102 or some thereof may be stored in the remote memory/storage device 1150. It will be well known that an illustrated network connection is exemplary and other means configuring a communication link among computers may be used.

The computer 1102 performs an operation of communicating with predetermined wireless devices or entities which are disposed and operated by the wireless communication, for example, the printer, a scanner, a desktop and/or a portable computer, a portable data assistant (PDA), a communication satellite, predetermined equipment or place associated with a wireless detectable tag, and a telephone. This at least includes wireless fidelity (Wi-Fi) and Bluetooth wireless technology. Accordingly, communication may be a predefined structure like the network in the related art or just ad hoc communication between at least two devices.

The wireless fidelity (Wi-Fi) enables connection to the Internet, and the like without a wired cable. The Wi-Fi is a wireless technology such as the device, for example, a cellular phone which enables the computer to transmit and receive data indoors or outdoors, that is, anywhere in a communication range of a base station. The Wi-Fi network uses a wireless technology called IEEE 802.11(a, b, g, and others) in order to provide safe, reliable, and high-speed wireless connection. The Wi-Fi may be used to connect the computers to each other or the Internet and the wired network (using IEEE 802.3 or Ethernet). The Wi-Fi network may operate, for example, at a data rate of 11 Mbps (802.11a) or 54 Mbps (802.11b) in unlicensed 2.4 and 5 GHz wireless bands or operate in a product including both bands (dual bands).

It will be appreciated by those skilled in the art that information and signals may be expressed by using various different predetermined technologies and techniques. For example, data, instructions, commands, information, signals, bits, symbols, and chips which may be referred in the above description may be expressed by voltages, currents, electromagnetic waves, magnetic fields or particles, optical fields or particles, or predetermined combinations thereof.

It may be appreciated by those skilled in the art that various exemplary logical blocks, modules, processors, means, circuits, and algorithm steps described in association with the exemplary embodiments disclosed herein may be implemented by electronic hardware, various types of programs or design codes (for easy description, herein, designated as software), or a combination of all of them. In order to clearly describe the intercompatibility of the hardware and the software, various exemplary components, blocks, modules, circuits, and steps have been generally described above in association with functions thereof. Whether the functions are implemented as the hardware or software depends on design restrictions given to a specific application and an entire system. Those skilled in the art of the present disclosure may implement functions described by various methods with respect to each specific application, but it should not be interpreted that the implementation determination departs from the scope of the present disclosure.

Various exemplary embodiments presented herein may be implemented as manufactured articles using a method, a device, or a standard programming and/or engineering technique. The term manufactured article includes a computer program, a carrier, or a medium which is accessible by a predetermined computer-readable storage device. For example, a computer-readable storage medium includes a magnetic storage device (for example, a hard disk, a floppy disk, a magnetic strip, or the like), an optical disk (for example, a CD, a DVD, or the like), a smart card, and a flash memory device (for example, an EEPROM, a card, a stick, a key drive, or the like), but is not limited thereto. Further, various storage media presented herein include one or more devices and/or other machine-readable media for storing information.

It will be appreciated that a specific order or a hierarchical structure of steps in the presented processes is one example of exemplary accesses. It will be appreciated that the specific order or the hierarchical structure of the steps in the processes within the scope of the present disclosure may be rearranged based on design priorities. Appended method claims provide elements of various steps in a sample order, but the method claims are not limited to the presented specific order or hierarchical structure.

The description of the presented exemplary embodiments is provided so that those skilled in the art of the present disclosure use or implement the present disclosure. Various modifications of the exemplary embodiments will be apparent to those skilled in the art and general principles defined herein can be applied to other exemplary embodiments without departing from the scope of the present disclosure. Therefore, the present disclosure is not limited to the exemplary embodiments presented herein, but should be interpreted within the widest range which is coherent with the principles and new features presented herein.

What is claimed is:

1. A method for evaluating a placement of semiconductor devices, the method performed by a computing device including at least one processor, the method comprising:
   receiving connection information representing a connection relationship between semiconductor devices;
   clustering the semiconductor devices based on the connection information;
   assuming a plurality of semiconductor devices included in the same cluster as one semiconductor device based on the clustering; and
   determining a reward value to train a neural network model based on one assumed semiconductor device,
   wherein the training of the neural network model includes:
      performing an action to dispose the semiconductor device in a canvas based on the state including the connection information, by means of the neural network model; and
      performing reinforcement learning for the neural network model by returning the determined reward value to the neural network model.

2. The method according to claim 1, wherein the clustering includes:
   converting the connection information with a hypergraph structure into an ordinary graph structure which expresses the connection relationship between semiconductor devices one to one.

3. The method according to claim 1, wherein the reward value is determined based on at least one of:
   a length of a wire which connects the semiconductor devices calculated in consideration of the semiconductor device assumed by the clustering; or
   a congestion of the semiconductor devices calculated in consideration of the semiconductor device assumed through the clustering.

4. The method according to claim 3, wherein the reward value is computed by a weighted sum of the length of wire and the congestion.

5. The method according to claim 3, wherein the length of the wire includes:
   a sum of wire lengths computed between the semiconductor device assumed by the clustering and the other external semiconductor device; and
   a fixed value of the length of the wire computed between the semiconductor devices in the clustering.

6. The method according to claim 3, wherein the congestion includes:
   a sum of congestions computed between the semiconductor device assumed by the clustering and the other external semiconductor device and
   a fixed value of the congestion computed between the semiconductor devices in the clustering.

7. A computer program stored in a non-transitory computer readable storage medium, wherein when the computer program is executed in one or more processors to perform the following operations to evaluate the placement of the semiconductor devices includes:
   an operation of receiving connection information representing a connection relationship between semiconductor devices;
   an operation of clustering the semiconductor devices based on the connection information;
   an operation of assuming a plurality of semiconductor devices included in the same cluster as one semiconductor device based on the clustering; and
   an operation of determining a reward value to train a neural network model based on one assumed semiconductor device,
   wherein the training of the neural network model includes:
      performing an action to dispose the semiconductor device in a canvas based on the state including the connection information, by means of the neural network model; and
      performing reinforcement learning for the neural network model by returning the determined reward value to the neural network model.

8. A computing device to evaluate placement of a semiconductor device, comprising:
   a processor including at least one core;
   a memory including executable program codes in the processor; and
   a network unit which receives connection information representing a connection relationship between semiconductor devices;
   wherein the processor is configured to:
   cluster the semiconductor devices based on the connection information;
   assume a plurality of semiconductor devices included in the same cluster as one semiconductor device based on the clustering; and
   determine a reward value to train a neural network model based on one assumed semiconductor device,
   wherein the training of the neural network model includes:
      performing an action to dispose the semiconductor device in a canvas based on the state including the connection information, by means of the neural network model; and
      performing reinforcement learning for the neural network model by returning the determined reward value to the neural network model.

* * * * *